United States Patent
Wang

(10) Patent No.: US 9,768,754 B2
(45) Date of Patent: Sep. 19, 2017

(54) CONTROL CIRCUIT FOR A GATE DRIVER CIRCUIT, OPERATING METHOD THEREOF AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Qian Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 31 days.

(21) Appl. No.: 14/520,882

(22) Filed: Oct. 22, 2014

(65) Prior Publication Data
US 2015/0333737 A1  Nov. 19, 2015

(30) Foreign Application Priority Data
May 16, 2014  (CN) .......................... 2014 1 0207348

(51) Int. Cl.
*G09G 1/00* (2006.01)
*H03K 3/012* (2006.01)
(Continued)

(52) U.S. Cl.
CPC ........... *H03K 3/012* (2013.01); *G09G 3/3696* (2013.01); *H03K 3/011* (2013.01); *G09G 3/3648* (2013.01);
(Continued)

(58) Field of Classification Search
CPC ........... G09G 1/005; G09G 2310/0213; G09G 2330/00–2330/028; G09G 3/18;
(Continued)

(56) References Cited

U.S. PATENT DOCUMENTS

| 6,674,623 B1 * | 1/2004 | Abe .................... G06F 1/206 257/E23.08 |
| 2004/0041762 A1 * | 3/2004 | Naiki .................. G09G 3/3696 345/87 |

(Continued)

FOREIGN PATENT DOCUMENTS

| CN | 101324715 A | 12/2008 |
| CN | 102543022 A | 7/2012 |
| CN | 102663980 A | 9/2012 |

OTHER PUBLICATIONS

1st Office Action issued in Chinese application No. 201410207348.8 dated Nov. 11, 2015.
(Continued)

*Primary Examiner* — Sanghyuk Park
(74) *Attorney, Agent, or Firm* — Nath, Goldberg & Meyer; Joshua B. Goldberg; Christopher Thomas

(57) ABSTRACT

The present invention discloses a control circuit for a gate driver circuit, an operating method thereof and a display device comprising the control circuit, the control circuit includes: a detection circuit, a power supply and a charge pump circuit, wherein, the detection circuit is used to generate a digital control signal corresponding to an ambient temperature based on the ambient temperature of the gate driver circuit, the power supply is used to supply an initial voltage to a pump charge circuit and the pump charge circuit is used to adjust the initial voltage based on the digital control signal to generate a driving voltage, and output the driving voltage to the gate driver circuit. By enabling the driving voltage to be dynamically adjustable, the power (Continued)

consumption of the gate driver circuit is reduced, and the life of the thin film transistor in the gate driver circuit is lengthened.

18 Claims, 3 Drawing Sheets

(51) Int. Cl.
*H03K 3/011* (2006.01)
*G09G 3/36* (2006.01)

(52) U.S. Cl.
CPC ............... *G09G 2300/0417* (2013.01); *G09G 2320/041* (2013.01); *G09G 2320/043* (2013.01); *G09G 2320/045* (2013.01); *G09G 2330/021* (2013.01)

(58) Field of Classification Search
CPC .......... G09G 3/34–3/38; G09G 3/3603; G09G 2310/0243–2310/0259; G09G 2320/041
See application file for complete search history.

(56) References Cited

U.S. PATENT DOCUMENTS

| | | | |
|---|---|---|---|
| 2007/0052646 A1* | 3/2007 | Ishiguchi | G09G 3/3648 345/92 |
| 2009/0102779 A1 | 4/2009 | Jo | |
| 2010/0053054 A1* | 3/2010 | Jeong | G09G 3/3674 345/92 |

OTHER PUBLICATIONS

Notification of the Second Office Action dated Apr. 15, 2016 corresponding to Chinese application No. 201410207348.8.

* cited by examiner

CONTROL CIRCUIT FOR A GATE DRIVER CIRCUIT, OPERATING METHOD THEREOF AND DISPLAY DEVICE

FIELD OF THE INVENTION

The present invention relates to the field of display technology, and particularly relates to a control circuit for a gate driver circuit, an operating method thereof and a display device including the control circuit.

BACKGROUND OF THE INVENTION

A conventional liquid crystal display controls pixels to display an image by using an external driver chip circuit to drive thin film transistors on a display panel. In recent years, with the development of technology, it has been developed to fabricate the structure of a driver circuit (instead of the external driver chip circuit) directly on the display panel of the liquid crystal display, so as to reduce the number of components on the conventional liquid crystal display and lower the fabrication cost, for example, a GOA (gate driver on array) technique, that is, a technique of integrating a gate driver circuit controlling the ON/OFF of a thin film transistor with a liquid display panel.

FIG. 1 is a schematic view showing a structure of a control circuit for a gate driver circuit in the prior art. As shown in FIG. 1, the control circuit includes: a power supply 1 and a charge pump circuit 3, the power supply 1 is used to supply an initial voltage to the charge pump circuit 3, and the charge pump circuit 3 is used to adjust the initial voltage to generate a driving voltage, wherein, the driving voltage is used to drive a thin film transistor (hereinafter, referred to as TFT) in a gate driver circuit 4 to be turned on, wherein the TFT is made of a semiconductor material.

However, the device that is made of a semiconductor material has a low precision and a poor stability, meanwhile, temperature, as an important parameter of the semiconductor, may affect the electron mobility, thereby causing a temperature drift. For TFTs, the so-called temperature drift refers to that a TFT in the gate driver circuit cannot be turned on normally due to the temperature variation, under the normal driving voltage, thereby affecting the normal outputs of the gate signal from the gate driver circuit. For example, when the temperature is too low, the electron mobility within the TFT is decreased, and the threshold voltage of the TFT is increased so that the TFT in the gate driver circuit cannot be turned on normally under the normal driving voltage, in this case, the driving voltage for the TFT in the gate driver circuit needs to be adjusted to a higher value, so as to turn on the TFT normally, and ensure the normal outputs of the gate signal.

Generally, the value of the driving voltage is set in a static setting manner, in order to avoid the problem that the TFT in the gate driver circuit cannot be turned on normally due to the temperature variation, the so-called static setting manner is that the driving voltage is set to be a relatively high and fixed value at the time of initialization. In this case, even when a change in the temperature occurs, the TFT in the gate driver circuit can be turned on normally.

However, as the driving voltage is a voltage with a relatively high and fixed value, the power consumption of the gate driver circuit is high during its operating process, and meanwhile, whenever the TFT is turned on, it may suffer a voltage surge, thereby shortening the life of the TFT.

SUMMARY OF THE INVENTION

The present invention provides a control circuit for a gate driver circuit, the operating method thereof and a display device, which, by enabling the driving voltage to be dynamically adjustable, can solve the problems of high power consumption of the gate driver circuit and short life of the TFT.

To achieve the above objects, the present invention provides a control circuit for a gate driver circuit, the control circuit includes:

a detection circuit, which is used to generate a digital control signal corresponding to an ambient temperature based on the ambient temperature of the gate driver circuit;

a power supply, which is used to supply an initial voltage to a pump charge circuit; and the pump charge circuit, which is used to adjust the initial voltage based on the digital control signal to generate a driving voltage, and output the driving voltage to the gate driver circuit.

Optionally, the detection circuit includes:

a temperature detection module, which is used to generate an analog output current corresponding to the ambient temperature based on the ambient temperature of the gate driver circuit;

a current-voltage conversion module, which is used to convert the analog output current to a corresponding analog output voltage;

an analog-digital conversion module, which is used to perform an analog-digital conversion on the analog output voltage to generate a corresponding digital output voltage; and a register, which is used to determine a digital control signal corresponding to the digital output voltage based on a pre-stored corresponding relationship between the digital output voltage and the digital control signal, and output the digital control signal.

Optionally, the temperature detection module includes: a voltage generator and at least one TFT with its gate and drain connected, the gate of the TFT is connected with the voltage generator, the source of the TFT is connected with the current-voltage conversion module, the voltage generator is used to supply a detection voltage to the TFT, and all of the at least one TFT generate the analog output current under the ambient temperature after the detection voltage is applied thereto.

Optionally, in a case where the number of the at least one TFT is more than one, all of the TFTs are connected in parallel.

Optionally, the number of the TFTs is four.

To achieve the above objects, the present invention provides a display device including the above-described control circuit for a gate driver circuit.

To achieve the above objects, the present invention also provides an operating method of a control circuit for a gate driver circuit, the operating method includes:

a step of generating a digital control signal corresponding to an ambient temperature by a detection circuit, based on the ambient temperature of the gate driver circuit;

a step of supplying an initial voltage to a charge pump circuit by a power supply; and a step of adjusting the initial voltage to generate a driving voltage by using the charge pump circuit based on the digital control signal and outputting the driving voltage to the gate driver circuit.

Optionally, the step of generating a digital control signal corresponding to an ambient temperature by a detection circuit, based on the ambient temperature of the gate driver circuit includes:

a step of generating an analog output current corresponding to the ambient temperature by a temperature detection module based on the ambient temperature of the gate driver circuit;

a step of converting the analog output current to a corresponding analog output voltage by a current-voltage conversion module;

a step of performing an analog-digital conversion on the analog output voltage to generate a corresponding digital output voltage by an analog-digital conversion module using; and a step of determining a digital control signal corresponding to the digital output voltage by a register based on a pre-stored corresponding relationship between the digital output voltage and the digital control signal, and outputting the digital control signal.

Optionally, the temperature detection module includes: a voltage generator and at least one TFT with its gate and drain connected, the gate of the TFT is connected with the voltage generator, and the drain of the TFT is connected with the current-voltage conversion module, the step of generating an analog output current corresponding to the ambient temperature by a temperature detection module based on the ambient temperature of the gate driver circuit includes steps of:

supplying a detection voltage to the at least one TFT by the voltage generator; and generating the analog output current by all of the at least one TFT under the ambient temperature after the detection voltage is applied thereto.

Optionally, in a case where the number of the at least one TFT is more than one, all the TFTs are connected in parallel.

Optionally, the number of the TFTs is four.

The present invention has the benefits as below.

The present invention provides a control circuit for a gate driver circuit, an operating method thereof and a display device, a digital control signal is generated by a detection circuit based on an ambient temperature of the gate driver circuit, and a charge pump circuit adjusts an initial voltage based on the digital control signal, so as to generate a driving voltage required to turn on the TFT normally under the current ambient temperature. In the technical solution of the present invention, by enabling the driving voltage to be dynamically adjustable, the power consumption of the gate driver circuit is reduced, and the life of the TFT in the gate driver circuit is lengthened.

DETAILED DESCRIPTION OF THE EMBODIMENTS

In order to enable the one skilled in the art to better understand the technical solutions of the present invention, a control circuit for a gate driver circuit, an operating method thereof and a display device will be described in more details in conjunction with the accompanying drawings. Obviously, the embodiments described herein are only a part but not all of embodiments of the present invention. All other embodiments obtained by the one skilled in the art without any creative effort, based on the embodiments of the present invention described herein, falls within the scope of the present invention.

Embodiment 1

Figure 1:
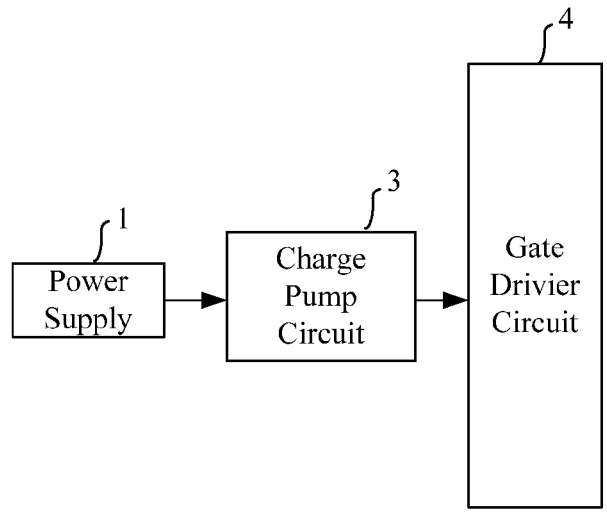
FIG. 1 is a schematic diagram showing a structure of a control circuit for a gate driver circuit in the prior art.
Figure 2:
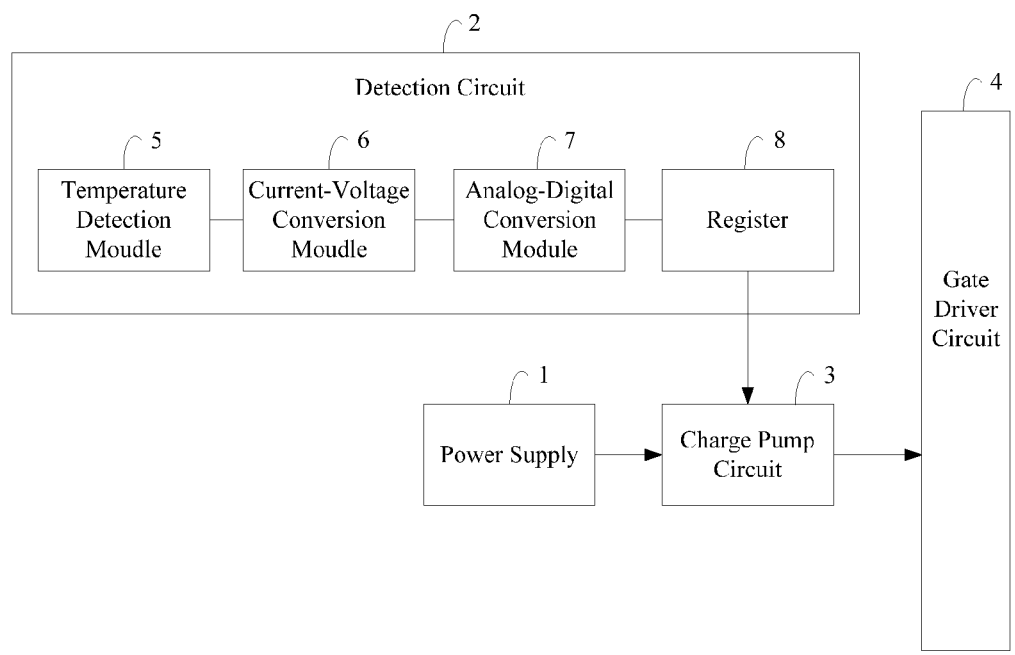
FIG. 2 is a schematic diagram showing a structure of a control circuit for a gate driver circuit according to Embodiment 1 of the present invention.

FIG. 2 is a schematic diagram showing a structure of a control circuit for a gate driver circuit according to Embodiment 1 of the present invention. As shown in FIG. 2, the control circuit includes: a power supply 1, a detection circuit 2 and a charge pump circuit 3, wherein, the detection circuit 2 generates a corresponding digital control signal based on an ambient temperature of a gate driver circuit 4, the power supply 1 is used to supply an initial voltage to the charge pump circuit 3, and the charge pump circuit 3 is used to adjust the initial voltage based on the digital control signal to generate a driving voltage, and output the driving voltage to the gate driver circuit 4.

According to the present invention, the detection circuit 2 senses a current ambient temperature of the gate driver circuit 4 and generates a digital control signal corresponding to the ambient temperature based on the current ambient temperature, the power supply 1 supplies an initial voltage to the charge pump circuit 3, and the charge pump circuit 3 adjusts the initial voltage under the control of the digital control signal, so as to generate a driving voltage corresponding to the current ambient temperature and capable of turning on the TFT normally. In the present invention, the driving voltage is not a voltage with a relatively high and fixed value, but a voltage with a variable value varied correspondingly with the variation of the ambient temperature. Specifically, when the ambient temperature is relatively high or normal, the value of the driving voltage output from the charge pump circuit 3 is relatively low; and when the ambient temperature is relatively low, the value of the driving voltage output from the charge pump circuit 3 is relatively high. In the long run, the driving voltage may not always be of a relatively high value, and therefore, compared with the prior art, the present invention can effectively reduce the power consumption of the gate driver circuit 4. Meanwhile, the number of the times that the TFT in the gate driver circuit 4 suffers the voltage surge is reduced, thereby the safety of the TFTs in the gate driver circuit 4 is ensured, and the life of the TFT in the gate driver circuit is lengthened effectively.

Figure 3:
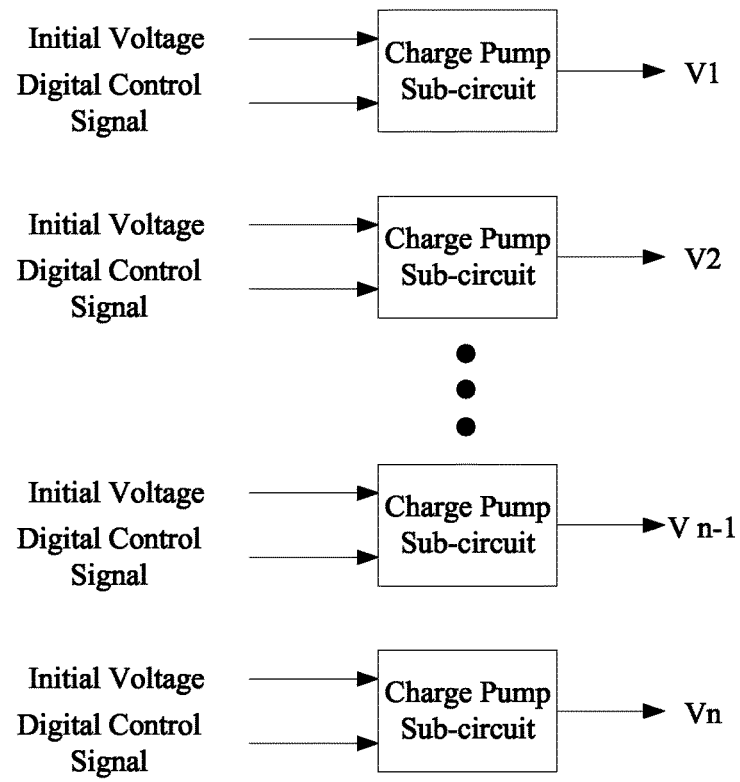
FIG. 3 is a schematic diagram showing a structure of the charge pump circuit shown in FIG. 2.

FIG. 3 is a schematic diagram of a structure of the charge pump circuit shown in FIG. 2. As shown in FIG. 3, a plurality of charge pump sub-circuits are provided in the charge pump circuit 3, the initial voltage supplied by the power supply 1 may be adjusted to a different driving voltage (any one of V1, V2, ..., Vn−1 and Vn) by a different charge pump sub-circuit, when the digital control signal output by the detection circuit 2 is received by the charge pump circuit 3, one of the charge pump sub-circuits in the charge pump circuit 3 operates, and the other charge pump sub-circuits do not operate.

The principle of realizing the present invention will be explained by taking a case where the value of the driving voltage may range from 15V to 25V and is an integer as an example. In this case, the ambient temperature may be divided into 11 sections, and the digital control signal corresponding to the ambient temperature may be encoded, for example, with four digits, specifically, the digital control signal may be encoded as 0000, 0001, 0010, 0011, 0100, 0101, 0110, 0111, 1000, 1111 and 1010, 11 in total, and the number of the charge pump sub-circuits in the charge pump circuit 3 is also 11, and specifically includes: a first charge pump sub-circuit, a second charge pump sub-circuit, . . . , a tenth charge pump sub-circuit and a eleventh charge pump sub-circuit. The first charge pump sub-circuit is activated when the digital control signal "0000" is received, adjusts the initial voltage to 15V and outputs 15V to the gate driver circuit 4; the second charge pump sub-circuit is activated when the digital control "0001" is received, adjusts the initial voltage to 16V and outputs 16V to the gate driver circuit 4; similarly, the eleventh charge pump sub-circuit is activated when the digital control signal "1010" is received, adjusts the initial voltage to 25V and outputs 25V to the gate driver circuit 4. In this manner, each of the ambient temperatures may correspond to a digital control signal, and each of the digital control signals may correspond to a driving voltage. According to the above description, the corresponding relationship among the ambient temperatures, the digital control signals and the driving voltages is shown in Table 1.

TABLE 1

The Correspondence relationship among the ambient temperatures, the digital control signals and the driving voltages

| Ambient temperature | Digital Control Signal | Charge pump sub-circuit | Driving Voltage (V) |
| --- | --- | --- | --- |
| (T9, +∞] | 0000 | the first charge pump sub-circuit | 15 |
| (T8, T9] | 0001 | the second charge pump sub-circuit | 16 |
| (T7, T8] | 0010 | the third charge pump sub-circuit | 17 |
| (T6, T7] | 0011 | the fourth charge pump sub-circuit | 18 |
| (T5, T6] | 0100 | the fifth charge pump sub-circuit | 19 |
| (T4, T5] | 0101 | the sixth charge pump sub-circuit | 20 |
| (T3, T4] | 0110 | the seventh charge pump sub-circuit | 21 |
| (T2, T3] | 0111 | the eighth charge pump sub-circuit | 22 |
| (T1, T2] | 1000 | the ninth charge pump sub-circuit | 23 |
| (T0, T1] | 1001 | the tenth charge pump sub-circuit | 24 |
| (-∞, T0] | 1010 | the eleventh charge pump sub-circuit | 25 |

Assuming that the ambient temperature is of a value within a section of (T3,T4], in this case, the digital control signal generated by the detection circuit 2 is "0110", and when this digital control signal "0110" is received by the charge pump circuit 3, the seventh charge pump sub-circuit in the charge pump circuit 3 operates, thereby adjusting the initial voltage to 21V.

It should be noted that the settings in this embodiment (e.g. the driving voltage ranges from 15V to 25V, the value of the driving voltage is an integer, the digital control signal is encoded by using four digits and the number of the charge pump sub-circuits in the charge pump circuit is 11) are only for the exemplary purpose, and is not intended to limit the technical solutions of the present invention. In the technical solutions of the present invention, the section and the number of the driving voltage may be designed according to actual situation, and the number of the charge pump sub-circuits in the charge pump circuit 3 and the number of the encoding digits for digital encoding may be changed correspondingly as well.

Next, the processes of generating the digital control signal by the detection circuit will be described in detail.

Optionally, the detection circuit 2 includes: a temperature detection module 5, a current-voltage conversion module 6, an analog-digital conversion module 7 and a register 8, wherein, the temperature detection module 5 is used to generate an analog output current based on the ambient temperature of the gate driver circuit 4, the current-voltage conversion module is used to convert the analog output current to a corresponding analog output voltage, the analog-digital conversion module 7 is used to perform an analog-digital conversion on the analog voltage to generate a corresponding digital output voltage, and the register 8 is used to determine a digital control signal corresponding to the digital output voltage based on a pre-stored relationship between the digital output voltages and the digital control signal, and output the digital control signal.

Figure 4:
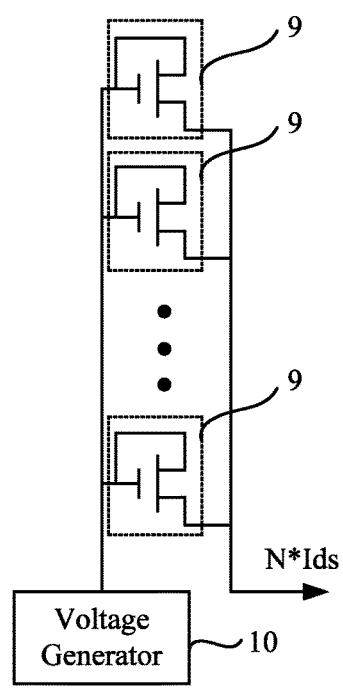
FIG. 4 is a schematic diagram showing a structure of the temperature detection module shown in FIG. 2.

FIG. 4 is a schematic diagram showing a structure of the temperature detection module 5 shown in FIG. 2. As shown in FIG. 4, the temperature detection module 5 includes: a voltage generator 10 and at least one TFT 9 with its gate and drain connected, the gate of each TFT 9 is connected with the voltage generator 10, and the source of each TFT 9 is connected with the current-voltage conversion module 6, the voltage generator 10 is used to supply a detection voltage to the at least one TFT 9, and each of the TFTs 9 generates the analog output current under the ambient temperature after the detection voltage is applied thereto.

Hereinafter, the operating principle of the temperature detection module 5 in this embodiment will be described in more details.

When the number of the TFT 9 in the temperature detection module 5 is one, after the detection voltage is applied to the TFT 9, a current $I_{ds}$ is output from its source, and this current $I_{ds}$ satisfies:

$$I_{ds}=\mu_{eff}(\epsilon_{ins}*\epsilon_0/t_{ins})(W/L)(V_{gs}-V_{th})V_{ds}$$

where, $\mu_{eff}$ is the electron mobility within the TFT 9, $t_{ins}$ the thickness of the gate insulation layer in the TFT 9, $\epsilon_{ins}*\epsilon_0/t_{ins}$ is the capacitance per unit area of the gate insulation layer, W is the width of the channel, L is the length of the channel, $V_{gs}$ is the gate-source voltage, $V_{th}$ is the threshold voltage, and $V_{ds}$ is the drain-source voltage. In the present invention, the gate-source voltage equals to the detection voltage, and $Vgs>V_{th}$, and meanwhile, since the gate and the source of the TFT 9 are connected with each other, $V_{gs}=V_{ds}$.

In the present invention, the thickness $t_{ins}$ of the gate insulation layer, the capacitance $\epsilon_{ins}*\epsilon_0/t_{ins}$ per unit area of the gate insulation layer, the width W of the channel, the length L of the channel, the gate-source voltage $V_{gs}$, the threshold voltage $V_{th}$ and the drain-source voltage $V_{ds}$ are all constants, and therefore, the current $I_{ds}$ is in direct proportion to the electron mobility $\mu_{eff}$. Meanwhile, since the variation of the ambient temperature may lead to a corresponding variation of the electron mobility $\mu_{eff}$, therefore, there is a one-to-one correspondence between the ambient temperature and the current $I_{ds}$.

In this case, the analog output current generated by the temperature detection module 5 is $I_{ds}$, this analog output current (that is, an analog current signal) is converted, by the current-voltage conversion module 6, to an analog output voltage (that is, an analog voltage signal) through a current-voltage conversion, and then the analog output voltage is converted, by the analog-digital conversion module 7, to a digital output voltage through an analog-digital conversion. It can thus be known from the above that there is also a one-to-one correspondence between the digital output voltage and the ambient temperature.

Also, the correspondence relationship between the digital output voltage and the digital control signal is pre-stored in the register 8, and therefore, when the digital output voltage is received by the register 8, a digital control signal corresponding to the digital output voltage is output.

It should be noted that each of the ambient temperatures may correspond to only one digital control signal, and the ambient temperatures having different values within the same temperature section may correspond to the same digital control signal.

In the present invention, when the number of TFT 9 in the temperature detection module 5 is one, the analog output current is $I_{ds}$ and this analog output current is too weak to be obtained and processed conveniently. Optionally, when the number of the TFTs 9 in the temperature detection module 5 is more than one, all the TFTs 9 are connected in parallel, that is, the gates of all the TFTs 9 are connected and the sources of all the TFTs 9 are connected. In this case, the analog output current is $N*I_{ds}$, and N is the number of the TFTs 9 in parallel, thus, the analog output current is stronger and easy to be obtained and processed.

However, if the number of the TFTs 9 in parallel is too large, the difficulty of the production process of the temperature detection module 5 is increased and the cost is also increased. In this embodiment, preferably, the number of the TFTs 9 in parallel in the temperature detection module 5 is four.

It should be noted that, preferably, the temperature detection module 5 may be provided in the gate driver circuit 4 so as to obtain the ambient temperature of the gate driver circuit 4 with more precision, and more preferably, the temperature detection module 5 is provided around the critical TFTs in the gate driver circuit 4.

In the control circuit for the gate driver circuit according to Embodiment 1 of the present invention, a corresponding digital control signal is generated by a detection circuit based on an ambient temperature of the gate driver circuit, and a charge pump circuit adjusts an initial voltage based on the digital control signal, so as to generate a driving voltage required to turn on the TFT normally under the current ambient temperature, therefore, the driving voltage becomes dynamically adjustable, thus the power consumption of the gate driver circuit is reduced, and the life of the TFT in the gate driver circuit is lengthened.

Embodiment 2

According to Embodiment 2 of the present invention, there is provided a display device including a control circuit for a gate driver circuit, which is the control circuit for a gate driver circuit according to Embodiment 1 of the present invention, and the detailed description thereof is omitted.

The display device includes the control circuit for a gate driver circuit, which includes: a detection circuit, a power supply and a charge pump circuit, a digital control signal is generated by using the detection circuit based on an ambient temperature of the gate driver circuit, and a charge pump circuit adjusts an initial voltage based on the digital control signal, so as to generate a driving voltage required to turn on the TFT normally under the current ambient temperature, therefore, the driving voltage becomes dynamically adjustable, the power consumption of the gate driver circuit is reduced, and the life of the TFT in the gate driver circuit is lengthened, thus improving the performance of the display device.

Embodiment 3

Figure 5:
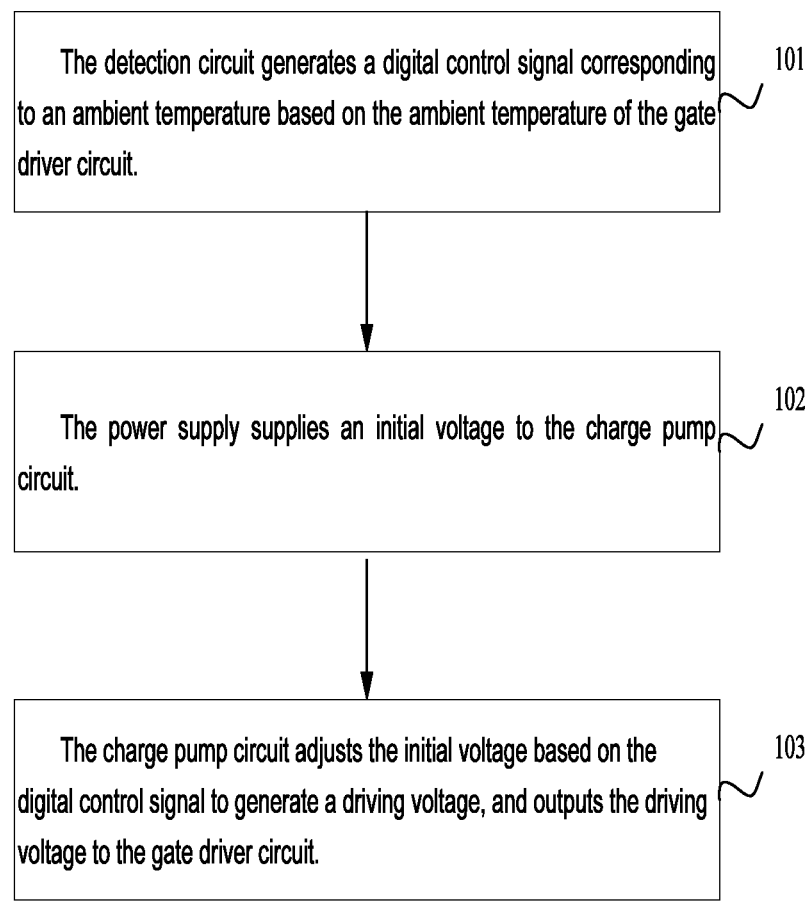
FIG. 5 is a flowchart showing an operating method of a control circuit for a gate driver circuit according to Embodiment 3 of the present invention.

FIG. 5 is a flowchart showing an operating method of a control circuit for a gate driver circuit according to Embodiment 3 of the present invention. Here, the gate driver circuit includes: a detection circuit, a power supply and a charge pump circuit, and as shown in FIG. 5, the operating method includes the following steps 101 to 103.

Step 101: the detection circuit generates a digital control signal corresponding to an ambient temperature based on the ambient temperature of the gate driver circuit.

Optionally, the detection circuit includes: a temperature detection module, a current-voltage conversion module, an analog-digital conversion module and a register, and the step 101 includes the following steps 1011 to 1014.

Step 1011: an analog output current corresponding to the ambient temperature is generated by using the temperature detection module based on the ambient temperature of the gate driver circuit.

Here, the temperature detection module includes: a voltage generator and at least one TFT, and the gate and the drain of each TFT are connected with each other, the gate of each TFT is connected with the voltage generator, and the source of each TFT is connected with a current-voltage conversion module. Optionally, when the number of the at least one TFT is more than one, all the TFTs are connected in parallel, preferably, the number of the TFTs in parallel is four.

Assuming that the number of the at least one TFT in the temperature detection module is one, in this case, after a detection voltage is applied to the TFT, a current $I_{ds}$ is output from its source, and this current $I_{ds}$ satisfies:

$$I_{ds} = \mu_{eff}(\epsilon_{ins}*\epsilon_0/t_{ins})(W/L)(V_{gs}-V_{th})V_{ds}$$

where, $\mu_{eff}$ is the electron mobility within the TFT, $t_{ins}$ is the thickness of the gate insulation layer in the TFT, $\epsilon_{ins}*\epsilon_0/t_{ins}$ is the capacitance per unit area of the gate insulation layer, W is the width of the channel, L is the length of the channel, $V_{gs}$ is the gate-source voltage, $V_{th}$ is the threshold voltage, and $V_{ds}$ is the drain-source voltage. In the present invention, the gate-source voltage equals to the detection voltage, and $V_{gs} > V_{th}$, and meanwhile, since the gate and the source of the TFT are connected with each other, $V_{gs} = V_{ds}$.

In the present invention, the thickness $t_{ins}$ of the gate insulation layer, the capacitance $\epsilon_{ins}*\epsilon_0/t_{ins}$ per unit area the gate insulation layer, the width W of the channel, the length L of the channel, the gate-source voltage $V_{gs}$, the threshold voltage $V_{th}$ and the drain-source voltage $V_{ds}$ are all constants, therefore, the current $I_{ds}$, output from the source of the TFT is in direct proportion to the electron mobility $\mu_{eff}$. Meanwhile, since the variation of the ambient temperature may lead to a corresponding variation of the electron mobility $\mu_{eff}$, therefore, there is a corresponding relationship between the ambient temperature and the current $I_{ds}$.

It can be derived from the above description that when the number of the at least one TFT in the temperature detection module is N (N>=1 and N is an integer), there is a corresponding relationship between the ambient temperature and the analog output current $N*I_{ds}$.

In step 1011, the analog output current output from the temperature detection module is different under a different ambient temperature.

In step 1012: the analog output current is converted to a corresponding analog output voltage by the current-voltage conversion module.

In step 1013: an analog-digital conversion is performed on the analog output voltage to generate a corresponding digital output voltage by the analog-digital conversion module.

The analog output current is converted to the digital output voltage through the current-voltage conversion process in step 1012 and the analog-digital conversion process in step 1013, and therefore, there is a corresponding relationship between the digital output voltage and the ambient temperature.

Step 1014: a digital control signal corresponding to the digital output voltage is determined by using a register based on a pre-stored corresponding relationship between the digital output voltage and the digital control signal, and the digital control signal is output.

In the present invention, there is a corresponding relationship between the ambient temperature and the digital output voltage, and meanwhile there is also a corresponding relationship between the digital output voltage and the digital control signal, thus, there is a corresponding relationship between the ambient temperature and the digital control signal.

In step 1014, the corresponding relationship between the digital output voltage and the digital control signal is pre-stored in the register, therefore, when the digital output voltage is received by the register, the register outputs the digital control signal corresponding to the digital output voltage.

Step 102: the power supply supplies an initial voltage to the charge pump circuit.

It should be noted that the step 101 and the step 102 may be performed simultaneously.

Step 103: the charge pump circuit adjusts the initial voltage based on the digital control signal, to generate a driving voltage, and outputs the driving voltage to the gate driver circuit.

In step 103, a plurality of charge pump sub-circuits are provided in the charge pump circuit, a different charge pump sub-circuit may adjust the initial voltage to a different driving voltage. When the digital control signal is received by the charge pump circuit, the corresponding charge pump sub-circuit in the charge pump circuit starts to operate, so as to output the desired driving voltage.

In the present invention, the corresponding digital control signal can be generated based on the ambient temperature of the gate driver circuit, and the charge pump circuit outputs the corresponding driving voltage under the control of the digital control signal, thereby realizing that the driving voltage is dynamically adjustable with the variation in the ambient temperature.

In the operating method of the control circuit for a gate driver circuit according to the Embodiment 3 of the present invention, a digital control signal is generated by the detection circuit based on an ambient temperature of the gate driver circuit, and an initial voltage is adjusted by the charge pump circuit based on the digital control signal, so as to generate a driving voltage required to turn on the TFT normally under the current ambient temperature. In the technical solution of the present invention, by enabling the driving voltage to be dynamically adjustable, the power consumption of the gate driver circuit is reduced, and the life of the TFT in the gate driver circuit is lengthened.

It should be understood that, the above implementations are only exemplary embodiments for the purpose of explaining the principle of the present invention, and the present invention is not limited thereto. For a person skilled in the art, various improvements and modifications may be made to the present invention without departing from the spirit and essence of the present invention. These improvements and modifications are also deemed as the protection scope of the present invention.

What is claimed is:

1. A control circuit for a gate driver circuit, comprising a detection circuit, a power supply and a pump charge circuit, wherein:

the detection circuit is used to generate a digital control signal corresponding to an ambient temperature based on the ambient temperature of the gate driver circuit and output the digital control signal to the pump charge circuit;

the power supply is used to supply an initial voltage to the pump charge circuit; and the pump charge circuit is used to adjust the initial voltage based on the digital control signal received from the detection circuit to generate a driving voltage, and output the driving voltage to the gate driver circuit, wherein the pump charge circuit comprises a plurality of pump charge sub-circuits capable of adjusting the initial voltage to different driving voltages, each pump charge sub-circuit comprising a first input end for receiving the digital control signal and a second input end for receiving the initial voltage and configured to start operation, according to the digital control signal received by the first input end, to adjust the initial voltage received by the second input end to the driving voltage for outputting to the gate driver circuit.

2. The control circuit for a gate driver circuit according to claim 1, wherein, the detection circuit includes:

a temperature detection module, which is used to generate an analog output current corresponding to the ambient temperature based on the ambient temperature of the gate driver circuit;

a current-voltage conversion module, which is used to convert the analog output current to a corresponding analog output voltage;

an analog-digital conversion module, which is used to perform an analog-digital conversion on the analog output voltage to generate a corresponding digital output voltage; and a register, which is used to determine a digital control signal corresponding to the digital output voltage based on a pre-stored corresponding relationship between the digital output voltage and the digital control signal, and output the digital control signal.

3. The control circuit for a gate driver circuit according to claim 2, wherein, the temperature detection module includes: a voltage generator and at least one thin film transistor with its gate and drain connected, the gate of each of the at least one thin film transistor is connected with the voltage generator, and the source of each of the at least one thin film transistor is connected with the current-voltage conversion module, the voltage generator is used to supply a detection voltage to the at least one thin film transistor, all of the at least one thin film transistors generate the analog output current under the ambient temperature after the detection voltage is applied thereto.

4. The control circuit for a gate driver circuit according to claim 3, wherein, when the number of the at least one thin film transistor is more than one, all the thin film transistors are connected in parallel.

5. The control circuit for a gate driver circuit according to claim 4, wherein, the number of the thin film transistors is four.

6. The control circuit for a gate driver circuit according to claim 1, wherein, the plurality of pump charge sub-circuits is more than two pump charge sub-circuits.

7. A display device, comprising a control circuit for a gate driver circuit, the control circuit comprising a detection circuit, a power supply and a pump charge circuit, wherein:
the detection circuit is used to generate a digital control signal corresponding to an ambient temperature based on the ambient temperature of the gate driver circuit and output the digital control signal to the pump charge circuit;
the power supply is used to supply an initial voltage to the pump charge circuit; and
the pump charge circuit is used to adjust the initial voltage based on the digital control signal received from the detection circuit and generate a driving voltage, and output the driving voltage to the gate driver circuit, wherein the pump charge circuit comprises a plurality of pump charge sub-circuits capable of adjusting the initial voltage to different driving voltages, each pump charge sub-circuit comprising a first input end for receiving the digital control signal and a second input end for receiving the initial voltage and configured to start operation, according to the digital control signal received by the first input end, to adjust the initial voltage received by the second input end to the driving voltage for outputting to the gate driver circuit.

8. The display device according to claim 7, wherein, the detection circuit includes:
a temperature detection module, which is used to generate an analog output current corresponding to the ambient temperature based on the ambient temperature of the gate driver circuit;
a current-voltage conversion module, which is used to convert the analog output current to a corresponding analog output voltage;
an analog-digital conversion module, which is used to perform an analog-digital conversion on the analog output voltage to generate a corresponding digital output voltage; and
a register, which is used to determine a digital control signal corresponding to the digital output voltage based on a pre-stored corresponding relationship between the digital output voltage and the digital control signal, and output the digital control signal.

9. The display device according to claim 8, wherein, the temperature detection module includes: a voltage generator and at least one thin film transistor with its gate and drain connected, the gate of each of the at least one thin film transistor is connected with the voltage generator, and the source of each of the at least one thin film transistor is connected with the current-voltage conversion module, the voltage generator is used to supply a detection voltage to the at least one thin film transistor, all of the at least one thin film transistor generate the analog output current under the ambient temperature after the detection voltage is applied thereto.

10. The display device according to claim 9, wherein, when the number of the at least one thin film transistor is more than one, all the thin film transistors are connected in parallel.

11. The display device according to claim 10, wherein, the number of the thin film transistors is four.

12. The display device according to claim 7, wherein, the plurality of pump charge sub-circuits is more than two pump charge sub-circuits.

13. An operating method of a control circuit for a gate driver circuit, the control circuit comprising a detection circuit, a power supply and a pump charge circuit, the operating method includes:
a step of generating a digital control signal corresponding to an ambient temperature by the detection circuit, based on the ambient temperature of the gate driver circuit, and outputting the digital control signal to the pump charge circuit;
a step of supplying an initial voltage to the charge pump circuit by the power supply; and
a step of adjusting the initial voltage to generate a driving voltage by the charge pump circuit based on the digital control signal received from the detection circuit and outputting the driving voltage to the gate driver circuit, wherein the pump charge circuit comprises a plurality of pump charge sub-circuits capable of adjusting the initial voltage to different driving voltages, each pump charge sub-circuit comprising a first input end for receiving the digital control signal and a second input end for receiving the initial voltage and configured to start operation, according to the digital control signal received by the first input end, to adjust the initial voltage received by the second input end to the driving voltage for outputting to the gate driver circuit.

14. The operating method of a control circuit for a gate driver circuit according to claim 13, wherein, the step of generating a digital control signal corresponding to an ambient temperature by a detection circuit, based on the ambient temperature of the gate driver circuit includes:
a step of generating an analog output current corresponding to the ambient temperature by a temperature detection module based on the ambient temperature of the gate driver circuit;
a step of converting the analog output current to a corresponding analog output voltage by a current-voltage conversion module;
a step of performing an analog-digital conversion on the analog output voltage to generate a corresponding digital output voltage by an analog-digital conversion module; and
a step of determining a digital control signal corresponding to the digital output voltage by using a register based on a pre-stored corresponding relationship between the digital output voltage and the digital control signal, and outputting the digital control signal.

15. The operating method of a control circuit for a gate driver circuit according to claim 14, wherein, the temperature detection module includes: a voltage generator and at least one thin film transistor with its gate and drain connected, the gate of each of the at least one thin film transistor is connected with the voltage generator, and the source of each of the at least one thin film transistor is connected with the current-voltage conversion module, and the step of generating an analog output current corresponding to the ambient temperature by a temperature detection module based on the ambient temperature of the gate driver circuit includes steps of:
supplying the detection voltage to the at least one thin film transistor by the voltage generator; and
generating the analog output current by all of the at least one thin film transistors under the ambient temperature after the detection voltage is applied thereto.

16. The operating method of a control circuit for a gate driver circuit according to claim 15, wherein, when the number of the at least one thin film transistor is more than one, all the thin film transistors are connected in parallel.

17. The operating method of a control circuit for a gate driver circuit according to claim 16, wherein, the number of the thin film transistors is four.

18. The operating method of a control circuit for a gate driver circuit according to claim 13, wherein, the plurality of pump charge sub-circuits is more than two pump charge sub-circuits.

* * * * *